United States Patent
Kim et al.

(10) Patent No.: US 11,239,885 B2
(45) Date of Patent: Feb. 1, 2022

(54) NEAR FIELD COMMUNICATION METHOD AND TRANSCEIVER WITH CLOCK RECOVERY

(71) Applicant: Samsung Electronics Co., Ltd., Suwon-si (KR)

(72) Inventors: Seong Joong Kim, Hwaseong-si (KR); Joonseong Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/857,355

(22) Filed: Apr. 24, 2020

(65) Prior Publication Data

US 2021/0159944 A1  May 27, 2021

(30) Foreign Application Priority Data

Nov. 26, 2019 (KR) .................. 10-2019-0153390

(51) Int. Cl.
| | |
|---|---|
| *H04B 5/02* | (2006.01) |
| *H04B 5/00* | (2006.01) |
| *H03L 7/099* | (2006.01) |
| *H04L 7/033* | (2006.01) |
| *H03L 7/08* | (2006.01) |

(52) U.S. Cl.
CPC .............. *H04B 5/02* (2013.01); *H03L 7/0802* (2013.01); *H03L 7/099* (2013.01); *H04B 5/0081* (2013.01); *H04L 7/0331* (2013.01)

(58) Field of Classification Search
CPC ......... H04B 5/02; H04B 5/0081; H03L 7/099; H03L 7/0802; H03L 7/0331

USPC ........................................................ 455/41.1
See application file for complete search history.

(56) References Cited

U.S. PATENT DOCUMENTS

| | | | |
|---|---|---|---|
| 8,942,628 B2 | 1/2015 | Haverinen | |
| 9,124,413 B2 | 9/2015 | Savoj | |
| 2008/0235526 A1* | 9/2008 | Lee ................. | G06F 1/3215 713/320 |
| 2015/0146819 A1* | 5/2015 | Chowdhury ......... | H03F 1/0227 375/296 |

(Continued)

FOREIGN PATENT DOCUMENTS

| | | |
|---|---|---|
| CN | 104182027 A | 12/2014 |
| JP | 2002-185355 A | 6/2002 |
| KR | 10-1999-0013076 A | 2/1999 |

OTHER PUBLICATIONS

Lee et al., "A Fully Integrated High Security NFC Target IC Using 0.18 μm CMOS Process," IEEE, 2011, pp. 551-554.

(Continued)

*Primary Examiner* — Eugene Yun
(74) *Attorney, Agent, or Firm* — NSIP Law

(57) ABSTRACT

A near field communication (NFC) transceiver includes a receiver, a transmitter, and a clock recovery circuit. The receiver is configured to recover a reception (RX) frame encoded with power supply information and information transmitted from a reader to a tag. The transmitter is configured to recover a transmission (TX) frame by a subcarrier load modulation scheme for information transmitted from the tag to the reader. The clock recovery circuit is configured to recover a carrier signal of the TX frame as a baseband clock signal of the NFC transceiver through a rail-to-rail boosting.

18 Claims, 7 Drawing Sheets

(56) References Cited

U.S. PATENT DOCUMENTS

2015/0177280 A1* 6/2015 Berringer ............ G01F 25/0007
324/679

OTHER PUBLICATIONS

Fiore et al., "A 13.56MHz RFID Tag with Active Envelope Detection in an Organic Complementary TFT Technology," 2014 IEEE International Solid-State Circuits Conference, 3 pages.

Lien et al., "A Self-Calibrating NFC SoC with a Triple-Mode Reconfigurable PLL and a Single-Path PICC-PCD Receiver in 0.11μm CMOS," 2014 IEEE International Solid-State Circuits Conference, Feb. 11, 2014, 3 pages.

Morris et al., "A 90nm CMOS 13.56MHz NFC transceiver," IEEE Asian Solid-State Circuits Conference, Nov. 16-18, 2009, Taipei, Taiwan, 4 pages.

* cited by examiner

NEAR FIELD COMMUNICATION METHOD AND TRANSCEIVER WITH CLOCK RECOVERY

CROSS-REFERENCE TO RELATED APPLICATIONS

This application claims the benefit under 35 USC § 119(a) of Korean Patent Application No. 10-2019-0153390, filed on Nov. 26, 2019, in the Korean Intellectual Property Office, the entire disclosure of which is incorporated herein by reference for all purposes.

BACKGROUND

1. Field

The following description relates to a near field communication (NFC) method and transceiver with a clock recovery.

2. Description of Related Art

An oscillator (OSC) in a clock recovery unit (CRU) may account for about half of a total amount of power to be consumed by a near field communication (NFC) tag. In particular, based on only a transceiver, excluding a digital base band (DBB) processor, at least half of the power consumed by the transceiver may be consumed by the oscillator. Thus, the total energy consumption amount of the NFC tag varies depending on how the oscillator is activated in an NFC operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a near field communication (NFC) transceiver includes a receiver, a transmitter, and a clock recovery circuit. The receiver is configured to recover a reception (RX) frame encoded with a power supply information and information transmitted from a reader to a tag. The transmitter is configured to recover a transmission (TX) frame by a subcarrier load modulation scheme for information transmitted from the tag to the reader. The clock recovery circuit is configured to recover a carrier signal of the TX frame as a baseband clock signal of the NFC transceiver through a rail-to-rail boosting.

The clock recovery circuit may be configured to interrupt or inhibit a supply of power for a generation of an oscillating signal and to use the carrier signal of the TX frame as the baseband clock signal in a TX mode in which the TX frame is recovered.

The clock recovery circuit may be further configured to select a signal from an oscillating signal output through a first path passing through a first comparator and a phase-locked loop (PLL) that is based on an oscillator (OSC) and the carrier signal of the TX frame output through a second path through the rail-to-rail boosting by a second comparator, based on one of a TX mode in which the TX frame is recovered, an RX mode in which the RX frame is received and a pooling mode in which the NFC transceiver retrieves a target tag, and configured to output the selected signal as the baseband clock signal.

In the TX mode or the pooling mode, the clock recovery circuit may be further configured to inhibit a supply of power to the OSC and the PLL and to select the carrier signal of the TX frame output through the second path as the baseband clock signal.

In the RX mode, the clock recovery circuit may be further configured to supply power to the OSC and the PLL and to select the oscillating signal output through the first path as the baseband clock signal.

In a TX mode in which the TX frame is recovered, the clock recovery circuit may be further configured to convert the carrier signal of the TX frame into a full swing carrier signal and to output the full swing carrier signal as the baseband clock signal.

The clock recovery circuit may be further configured to convert the carrier signal of the TX frame into the full swing carrier signal through a load modulation signal amplification.

The clock recovery circuit may include a PLL based on an OSC configured to output an oscillating signal, a first comparator configured to compare the oscillating signal to a first reference signal, a second comparator configured to compare the carrier signal of the TX frame to a second reference signal for the rail-to-rail boosting, and a multiplexer (MUX) configured to select one of the oscillating signal and the carrier signal of the TX frame based on one of a TX mode in which the TX frame is recovered, an RX mode in which the RX frame is received and a pooling mode in which the NFC transceiver retrieves a target tag.

The first comparator and the second comparator may be substantially identical to each other, and the first reference signal and the second reference signal may be substantially identical to each other.

A voltage of each of the first reference signal and the second reference signal may be less than that of a full swing carrier signal obtained by converting the carrier signal of the TX frame through the rail-to-rail boosting.

In another general aspect, a clock recovery circuit for an NFC transceiver may be configured to inhibit a supply of power for a generation of an oscillating signal, and recover a carrier signal of a TX frame as a baseband clock signal of the NFC transceiver through a rail-to-rail boosting, based on an operating mode of the NFC transceiver.

The clock recovery circuit may include a PLL based on an OSC configured to output the oscillating signal, a first comparator configured to compare the oscillating signal to a first reference signal, a second comparator configured to compare the carrier signal of the TX frame to a second reference signal for the rail-to-rail boosting, and a MUX configured to select one of the oscillating signal and the carrier signal of the TX frame based on one of a TX mode in which the TX frame is recovered, an RX mode in which an RX frame is received and a pooling mode in which the NFC transceiver retrieves a target tag.

The first comparator and the second comparator may be substantially identical to each other, and the first reference signal and the second reference signal may be substantially identical to each other.

A voltage of each of the first reference signal and the second reference signal may be less than a voltage of a full swing carrier signal obtained by converting the carrier signal of the TX frame through the rail-to-rail boosting.

In another general aspect, a method of controlling an NFC transceiver includes recovering an RX frame encoded for a power supply and information transmitted from a reader to a tag, or recovering a TX frame by a subcarrier load modulation for information transmitted from the tag to the reader, and recovering a carrier signal of the TX frame to a baseband clock signal of the NFC transceiver through a rail-to-rail boosting.

The recovering of the carrier signal of the TX frame may include receiving a mode selection signal based on one of a TX mode in which the TX frame is recovered, an RX mode in which the RX frame is received and a pooling mode in which the NFC transceiver retrieves a target tag, selecting a signal from an oscillating signal output through a first path passing through a first comparator and a PLL that is based on an OSC and the carrier signal of the TX frame output through a second path through the rail-to-rail boosting by a second comparator, based on the mode selection signal, and outputting the selected signal as the baseband clock signal.

The selecting of the signal may include, in response to a mode selection signal based on the TX mode or the pooling mode being received, inhibiting a power supply to the OSC and the PLL and selecting the carrier signal of the TX frame output through the second path as the baseband clock signal.

The selecting of the signal may include, in response to a mode selection signal based on the RX mode being received, supplying power to the OSC and the PLL and selecting the oscillating signal output through the first path as the baseband clock signal.

The recovering of the carrier signal of the TX frame may include, in a TX mode in which the TX frame is recovered, converting the carrier signal of the TX frame into a full swing carrier signal through the rail-to-rail boosting and outputting the full swing carrier signal as the baseband clock signal.

Other features and aspects will be apparent from the following detailed description, the drawings, and the claims.

Figure 1:
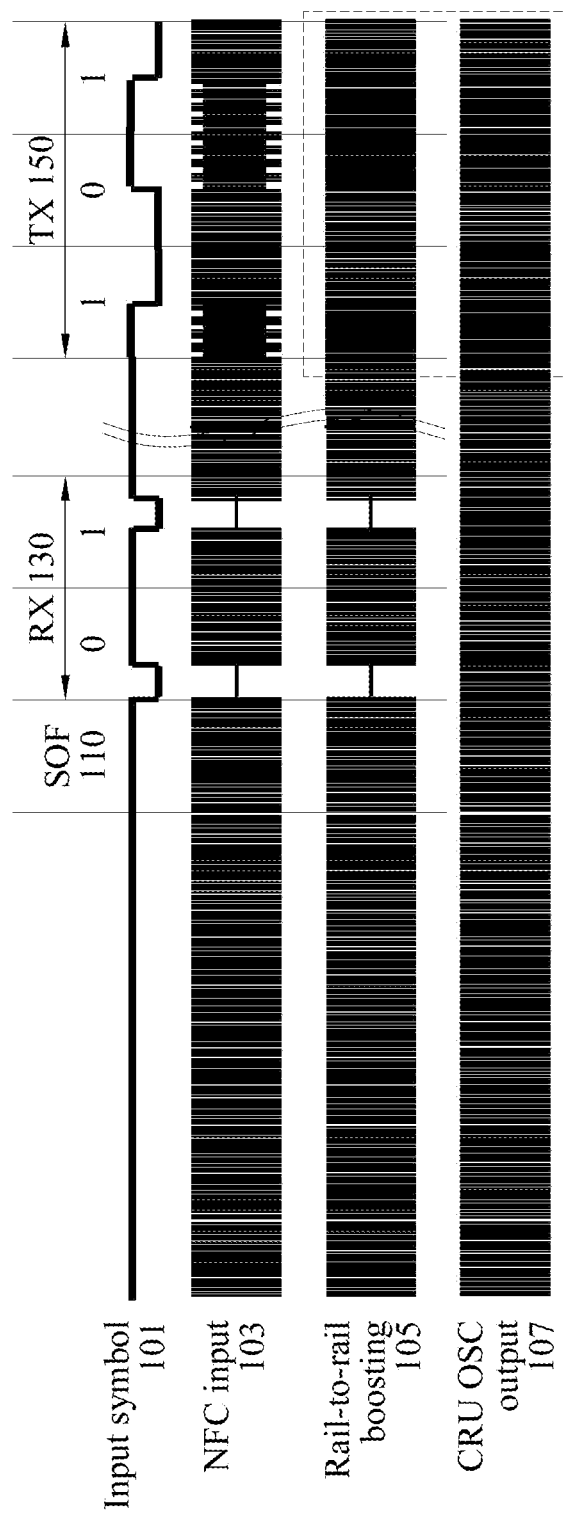
FIG. 1 illustrates a principle of recovering a clock by a near field communication (NFC) transceiver based on an International Organization for Standardization (ISO)/International Electrotechnical Commission (IEC) 14443 Type A standard.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood and in view of the disclosure of this application. Terms defined in dictionaries generally used should be construed to have meanings matching with contextual meanings in the related art and the disclosure of this application and are not to be construed as an ideal or excessively formal meaning unless otherwise defined herein.

Hereinafter, examples will be described in detail with reference to the accompanying drawings, and like reference numerals in the drawings refer to like elements throughout.

FIG. 1 illustrates a principle of recovering a clock by a near field communication (NFC) transceiver based on an International Organization for Standardization (ISO)/International Electrotechnical Commission (IEC) 14443 Type A standard. FIG. 1 illustrates an input symbol 101, an NFC input 103, a rail-to-rail boosting result 105, and an oscillator (OSC) output 107 of a clock recovery circuit. The input symbol 101 corresponds to a start of frame (SOF) interval 110, a reception (RX) interval 130, and a transmission (TX) interval 150 of the NFC transceiver.

An NFC is generally a contactless communication scheme that uses a frequency of 13.56 megahertz (MHz). The NFC may include, for example, a communication between a tag and a reader or a communication between devices. In such an example, the NFC changes a function of the tag and a function of the reader depending on circumstances, and accordingly, data may be bidirectionally transmitted.

As an example, an NFC transceiver herein corresponds to an NFC device complying with the ISO/IEC 14443 Type A standard. The ISO/IEC 14443 defines proximity communication and typically has a transmission range of about 10 centimeters (cm). The ISO/IEC 14443 is classified into Type A and Type B based on a data modulation and coding scheme and an anti-collision implementation scheme.

For example, in the ISO/IEC 14443 Type A, a 100% amplified-shift keying (ASK) modulation scheme may be used for energy supply and information transmitted from a reader to a tag. An encoding scheme may include, for example, a modified Miller coding. The reader may generate strong electromagnetic waves in an antenna coil, and an antenna coil of the tag may receive electromagnetic waves and use the electromagnetic waves as a power source. The tag may receive energy supply by magnetic induction. The antenna coil and a capacitor of the reader and the antenna coil and a capacitor of the tag may be designed to have matching resonant frequencies.

Also, in the ISO/IEC 14443 Type A, to send information from the tag to the reader, an on-off keying (OOK) modulation scheme and a subcarrier load modulation scheme of a Manchester coding may be used. A load modulation may be used to send the information from the tag to the reader. When an output voltage of a tag antenna is changed through an adjustment of a load resistance value, the same result as if an amplitude modulation is performed may be obtained. Since a signal of the reader is considerably higher than a signal of the tag, it is difficult to detect slight changes in voltages of the tag when a general carrier modulation scheme is used. Thus, by using the subcarrier load modulation scheme, the slight change in the voltage of the tag may be detected. A data transmission rate from the reader to the tag or from the tag to the reader may be, for example, 106 kbps. In the following description, the term "reader" may be referred to as an "interrogator" or a "proximity coupling device (PCD)," for example. Also, the term "tag" may be referred to as a "label," a "transponder" or a "proximity integrated circuit card (PICC)," for example. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Hereinafter, the NFC transceiver described herein may be understood as an NFC transceiver based on the ISO/IEC 14443 Type A standard, even though a separate description is not provided.

For example, the input symbol 101 is assumed to be applied to the NFC transceiver.

In the modified Miller coding used to supply energy and to transmit information from the reader to the tag, it may be impossible to output Y (no modulation) in two consecutive times even in a combination of data sequences of 0 and 1. Thus, an occurrence of "pause" after at least two consecutive Y indicates that a data transmission starts and a symbol before the "pause" may be the SOF 110 indicating a start of a frame.

Supply of power and information transmitted from the reader to the tag are performed during the RX interval 130, and information transmitted from the tag to the reader is performed during the TX interval 150. The TX interval may be referred to as a "sending interval." In the following description, the terms "TX interval" and "sending interval" are understood to have the same meanings.

The input symbol 101 is modified like the NFC input 103 and is input to the NFC transceiver. The input symbol 101 may be encoded by the modified Miller coding and a 100% ASK modulation scheme during the RX interval 130, and is encoded by the OOK modulation scheme and the subcarrier load modulation scheme of the Manchester coding during the TX interval 150, and may be modified like the NFC input 103.

The NFC input 103 is recovered to the rail-to-rail boosting result 105 for boosting from "0" to "1". A rail-to-rail boosting result 105, corresponding to the TX interval 150, may match the OSC output 107 of the CRU of the NFC transceiver. A reason why the rail-to-rail boosting result 105, corresponding to the TX interval 150, is used as a clock will be further described in detail with reference to FIG. 3 below.

In an example, a carrier signal of a TX frame recovered through a rail-to-rail boosting may be used as a baseband clock signal instead of operating an OSC of the CRU during a TX interval of the NFC transceiver, and thus. it may be possible to reduce the amount of power to be consumed by the OSC.

Figure 2:
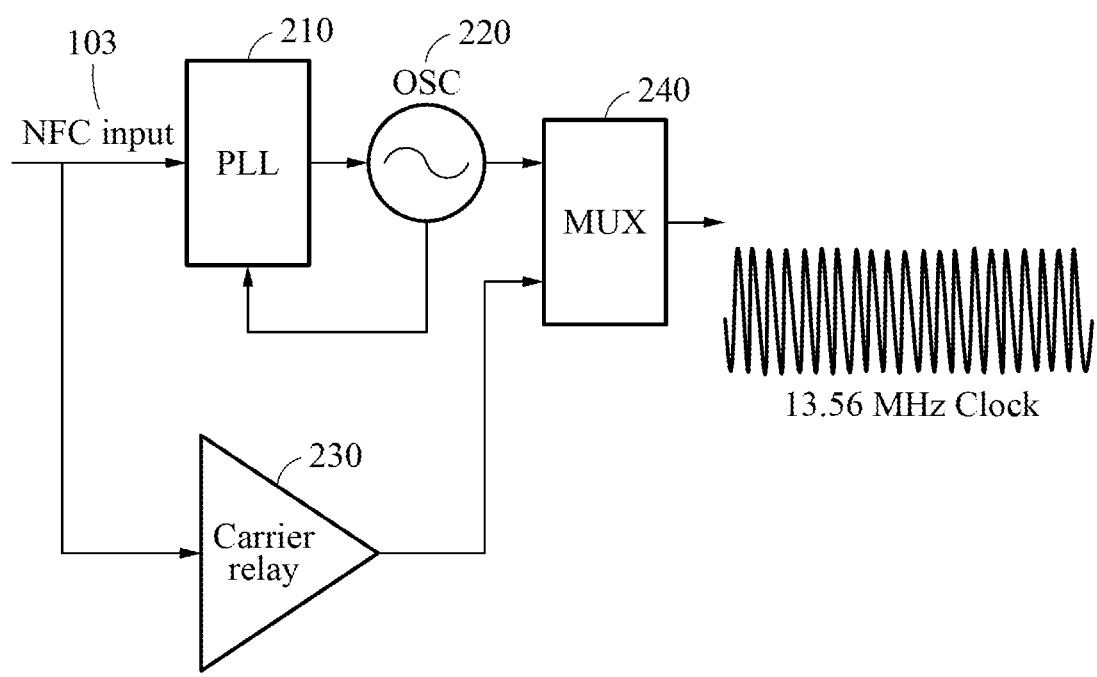
FIG. 2 illustrates an example operation of a clock recovery circuit of an NFC transceiver example.

FIG. 2 illustrates an example operation of a clock recovery circuit 200 of an NFC transceiver example. FIG. 2 illustrates the clock recovery circuit 200 that includes a phase-locked loop (PLL) 210, an OSC 220, a carrier relay 230, and a multiplexer (MUX) 240.

An NFC input 103 input to the clock recovery circuit 200 is transferred to the MUX 240 through a first path passing through the PLL 210 and the OSC 220 and a second path passing through the carrier relay 230. The second path corresponds to a rail-to-rail booster path for a direct carrier relay of a carrier of the NFC input 103 through the carrier relay 230. The carrier relay 230 includes a comparator.

During a sending interval of a TX frame having a subcarrier modulation characteristic, an output of the carrier relay 230, including the comparator may be, for example, a full swing carrier signal swinging between 0 and VDD, which indicates that an input carrier may be used as a baseband clock directly by the rail-to-rail booster.

Based on the above-described characteristics, a baseband clock of the NFC transceiver may be recovered. One of a signal of the OSC 220 and an output signal of the carrier relay 230 is selected using the MUX 240, and the selected signal is used as a baseband clock. The clock recovery circuit 200 turns off the PLL 210 and the OSC 220 during the sending interval of the TX frame, to reduce an amount of energy to be consumed by the NFC transceiver.

During the sending interval, the PLL 210 and the OSC 220 are turned off, and the carrier of the NFC input 103 passing through the carrier relay 230 is recovered by rail-to-rail boosting and is output as a clock signal of 13.56 MHz through the MUX 240.

Figure 3:
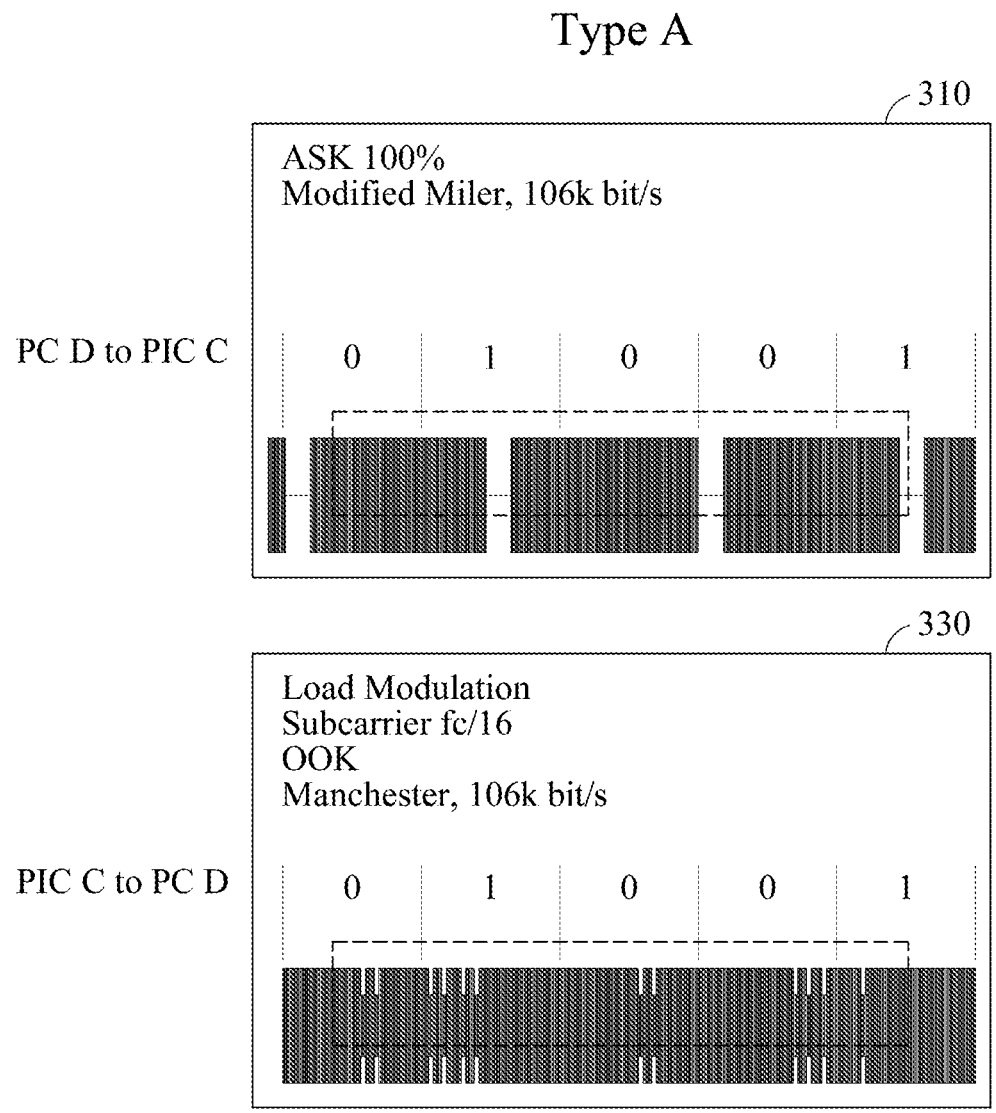
FIG. 3 illustrates an example difference between a signal transmitted from a reader to a tag and a signal transmitted from the tag to reader in an NFC transceiver example.

FIG. 3 illustrates an example of a difference between a signal transmitted from a reader to a tag and a signal transmitted from the tag to the reader in an NFC transceiver example. FIG. 3 illustrates a signal 310 received from a PCD to a PICC, that is, from the reader to the tag in an RX mode, and a signal 330 received from the PICC to the PCD, that is, from the tag to the reader in a TX mode.

As described above, in the ISO/IEC 14443 Type A, the signal 310, a signal modulated by the 100% ASK modulation scheme, may be used to transmit information from the reader to the tag. However, it may be impossible to recover the signal 310 modulated by the 100% ASK modulation scheme to a full swing carrier.

To transmit information from the tag to the reader, the signal 330, a signal recovered by the OOK modulation scheme and the subcarrier load modulation scheme of the Manchester coding, may be used. In an example, transmission of the information in the TX interval may require a modulation depth of at least 150 mV based on a standard, and an OOK modulation scheme having a modulation depth of 50% or less may be typically used. When the signal 330 is not a 100% amplitude shift keyed signal, the signal 330 may be recovered to the full swing carrier through a comparator.

An input signal modulated by the Manchester coding may be converted into a full swing carrier using a comparator with a low voltage of a reference signal. Thus, an OSC that consumes a large amount of power during a sending interval may be turned off, and a TX carrier signal converted into a full swing signal through a rail-to-rail booster may be used as a clock.

Figure 4:
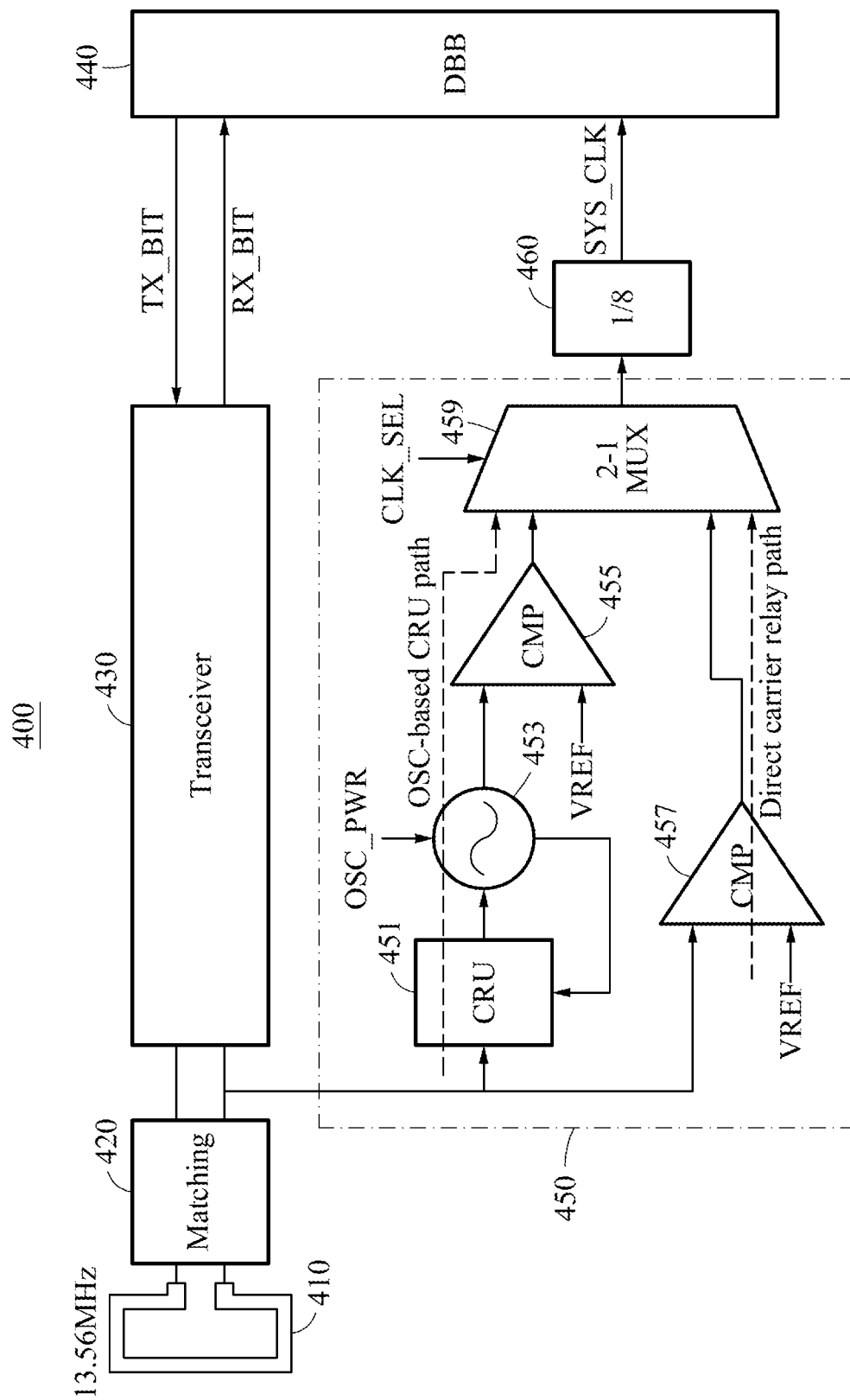
FIG. 4 illustrates an example structure of an NFC transceiver example.

FIG. 4 illustrates an example of a structure of an NFC transceiver 400. The NFC transceiver 400 of FIG. 4 includes an antenna coil 410, a matching circuit 420, a transceiver 430, a digital baseband (DBB) processor 440, a clock recovery circuit 450, and a divider 460.

The antenna coil 410 generates a strong electromagnetic wave through coupling with an antenna coil of another NFC transceiver or receives an electromagnetic wave generated by the antenna coil of the other NFC transceiver. The antenna coil 410 uses the received electromagnetic wave as power and receives an energy supply by magnetic induction. A capacitor and the antenna coil of the other NFC transceiver may have matching resonant frequencies.

The matching circuit 420 converts impedances of the antenna coil 410 and the transceiver 430, e.g., such that signals are transferred between the antenna coil 410 and the transceiver 430 at maximum efficiency.

The transceiver 430 may operate a receiver to recover an RX frame encoded for energy supply and information transmitted from a reader to a tag, or may operate a transmitter to recover a TX frame by a subcarrier load modulation scheme for a transfer of information from the tag to the reader. For example, the transceiver 430 may recover the encoded RX frame by a 100% ASK modulation scheme or a modified Miller coding, or may recover the TX frame by an OOK modulation scheme and a subcarrier load modulation scheme of a Manchester coding, as examples.

The DBB processor 440 generates a TX frame that includes a TX bit TX_BIT to be transmitted, based on a system clock signal SYS_CLK of 1.695 MHz obtained by the divider 460, transfers the TX frame to the transceiver 430, or processes an RX frame that includes an RX bit RX_BIT received through the transceiver 430.

The clock recovery circuit 450 may recover a carrier signal of the TX frame to a baseband clock signal through a rail-to-rail boosting. The clock recovery circuit 450 may interrupt or inhibit a power supply for a generation of an oscillating signal and recover the carrier signal of the TX frame to the baseband clock signal by the rail-to-rail boosting, based on an operating mode of the NFC transceiver 400. For example, in a TX mode in which the TX frame is recovered, the clock recovery circuit 450 may inhibit a power supply for a generation of an oscillating signal and recover the carrier signal of the TX frame to the baseband clock signal.

The clock recovery circuit 450 may include a CRU 451, an OSC 453, a first comparator 455, a second comparator 457, and a 2-1 MUX 459. The CRU 451 may be, for example, a PLL. In the following description, for convenience of explanation, the CRU 451 is referred to as a "PLL 451".

The PLL 451 may be, for example, a frequency negative feedback circuit configured to maintain a frequency of an output signal at a constant level all the time. In other words, the PLL 451 may match an input signal and a reference frequency and an output signal and a frequency. For example, the PLL 451 may allow the OSC 453 to oscillate at the same frequency as a frequency of the carrier signal of the TX frame.

The OSC 453 outputs an oscillating signal. The OSC 453 may output the oscillating signal by a frequency signal of which a phase received from the PLL 451 is fixed.

The first comparator 455 compares the oscillating signal of the OSC 453 to a first reference signal VREF. A path passing through the PLL 451 that is based on the OSC 453, and the first comparator 455 is referred to as a "first path" or an "OSC-based CRU path."

The second comparator 457 compares a second reference signal VREF to the carrier signal of the TX frame for the rail-to-rail boosting. A path passing through a rail-to-rail booster, including the second comparator 457, is referred to as a "second path" or a "direct carrier relay path."

The 2-1 MUX 459 selects one signal from the oscillating signal received through the first path and the carrier signal of the TX frame received through the second path, based on an operating mode of the NFC transceiver 400. For example, the TX mode of the TX frame, an RX mode of the RX frame or a pooling mode in which the NFC transceiver 400 retrieves a target tag. A selected signal CLK_SEL of the 2-1 MUX 459 is based on the operating mode of the NFC transceiver 400. In an example, "1" may be applied to the selected signal CLK_SEL in the TX mode, and "0" may be applied to the selected signal CLK_SEL in the RX mode and/or the pooling mode. In another example, "1" may be applied to the selected signal CLK_SEL in the TX mode and/or the pooling code, and "0" may be applied to the selected signal CLK_SEL in the RX mode. The clock recovery circuit 450 outputs the signal selected by the 2-1 MUX 459 as a baseband clock signal. The clock recovery circuit 450 switches an output of the 2-1 MUX 459 between the oscillating signal and the carrier signal of the TX frame by a carrier relay under control based on the selected signal CLK_SEL.

In this example, the first comparator 455 and the second comparator 457 may be identical to each other, and the first reference signal and the second reference signal may be identical to each other. Thus, it is possible to prevent or limit a phase error of a clock from occurring despite a change in a clock source such as the first path or the second path, e.g., by using the same comparators and the same reference signals. Also, a voltage of each of the first reference signal and the second reference signal may be less than a voltage of a full swing carrier signal obtained by converting the carrier signal of the TX frame through the rail-to-rail boosting.

In the TX mode or the pooling mode, the clock recovery circuit 450 inhibits the power supply to the PLL 451 and the OSC 453. The clock recovery circuit 450 selects the carrier signal of the TX frame output through the second path passing through the second comparator 457 as a baseband clock signal.

In the RX mode, the clock recovery circuit 450 supplies power to the PLL 451 and the OSC 453 and selects the oscillating signal output through the first path as a baseband clock signal.

In the TX mode in which the TX frame is recovered, the clock recovery circuit 450 converts the carrier signal of the TX frame into the full swing carrier signal, and outputs the full swing carrier signal as a baseband clock. For example, the clock recovery circuit 450 may convert the carrier signal of the TX frame into the full swing carrier signal through a load modulation signal amplification.

The divider 460 divides a baseband clock signal of 13.56 MHz output, for example, through the 2-1 MUX 459 by ⅛ to generate the system clock signal SYS_CLK of 1.695 MHz. The system clock signal SYS_CLK of 1.695 MHz may be provided to the DBB processor 440.

Figure 5:
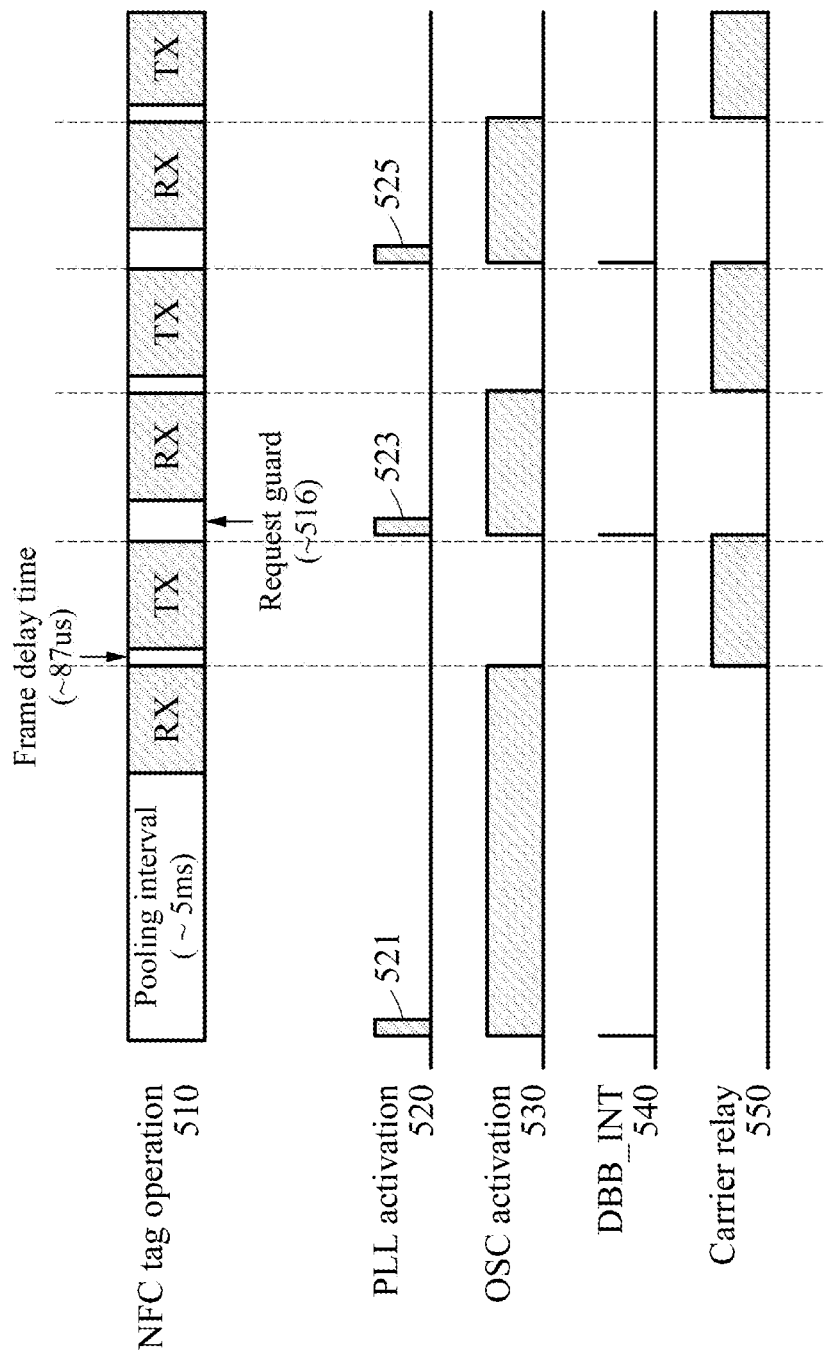
FIGS. 5 and 6 illustrate examples operations of components in an NFC transceiver example.

FIG. 5 illustrates an example of operations of components in an NFC transceiver example. FIG. 5 illustrates an NFC tag operation 510, and a PLL activation 520, an OSC activation 530, a DBB_INT 540 and a carrier relay 550 that correspond to the NFC tag operation 510.

For example, when an OSC and a PLL of a CRU continue to be in an on state during the NFC tag operation 510 in the NFC transceiver, a large amount of power may be consumed. In particular, when the PLL is in an activation state all the time during transmission and reception of data, power may continue to be consumed.

In the PLL activation 520 during the NFC tag operation 510, the NFC transceiver maintains an off state of the PLL during intervals other than lock times 521, 523 and 525 that allow the PLL to find a correct time. In the DBB_INT 540, a DBB processor generates an interrupt signal such that the PLL finds the correct time to lock the OSC. The OSC of the NFC transceiver is maintained in an off state during a TX interval in the OSC activation 530, and an input carrier passing through the carrier relay 550 is provided as a baseband clock.

The NFC transceiver turns the PLL and the OSC off during TX intervals, as shown in the PLL activation 520 and the OSC activation 530, to reduce energy consumption during transmission of NFC data.

Figure 6:
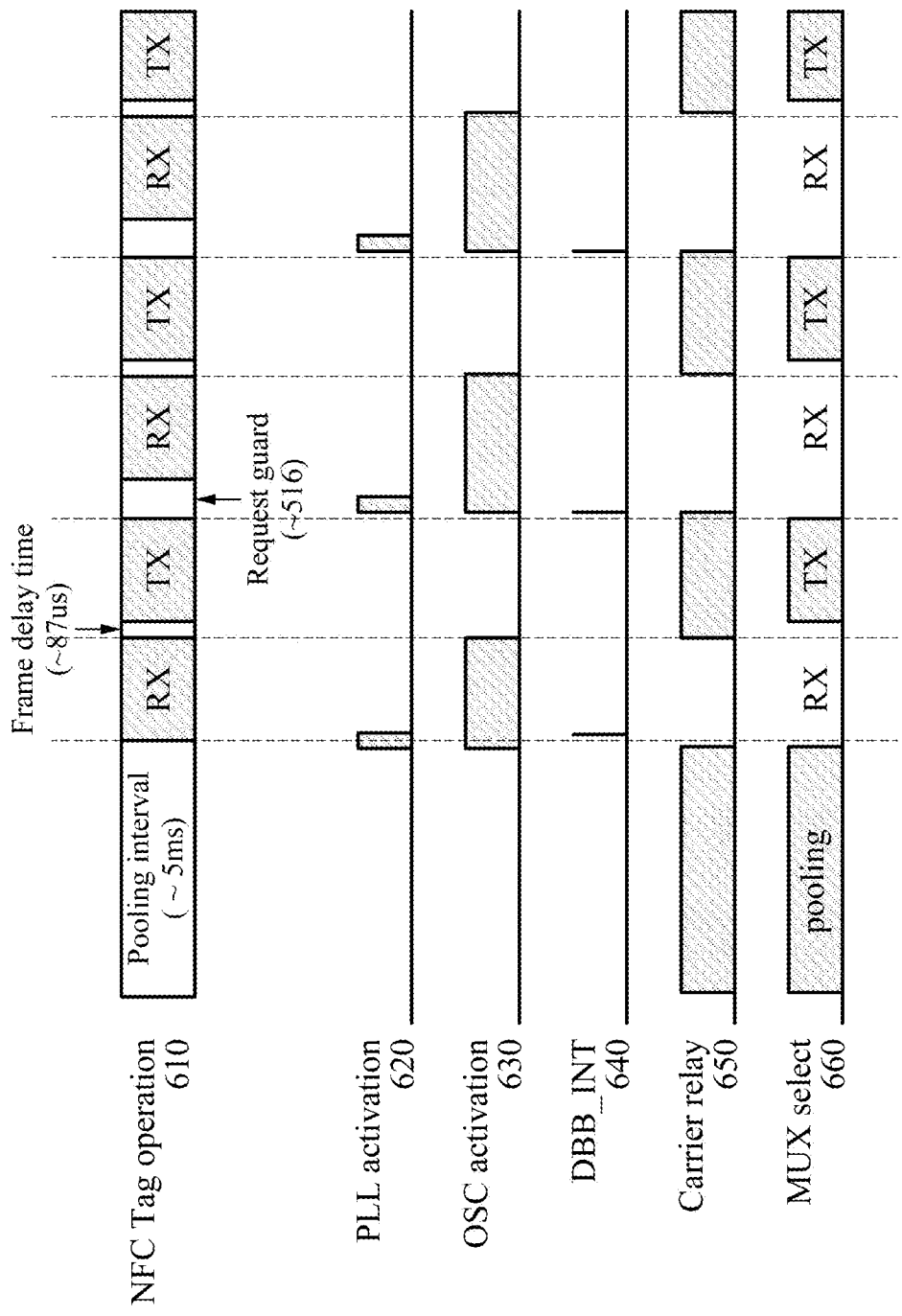

FIG. 6 illustrates example operations of components in an NFC transceiver example. FIG. 6 illustrates an NFC tag operation 610, and a PLL activation 620, an OSC activation 630, a DBB_INT 640, a carrier relay 650 and a MUX select 660 that correspond to the NFC tag operation 610.

In the PLL activation 620 during the NFC tag operation 610, the NFC transceiver maintains an off state of a PLL during intervals other than lock times of the PLL. In the DBB_INT 640, a DBB processor generates an interrupt signal such that the PLL finds the correct time. An OSC of the NFC transceiver is maintained in an off state during a TX interval and a pooling interval in the OSC activation 630. The NFC transceiver provides an input carrier passing through the carrier relay 650 as a baseband clock.

In an example, the NFC transceiver turns the PLL and the OSC off as shown in the PLL activation 620 and the OSC activation 630 even in a pooling interval in which the NFC transceiver retrieves a target tag when the NFC transceiver first operates, in addition to the above-described TX interval, to reduce energy consumption.

In this example, in the MUX select 660, a MUX selects one of an OSC-based CRU path that is a first path and a direct carrier relay path that is a second path. For example, "1" may be applied to the MUX select 660 in the pooling interval and the sending interval, and "0" may be applied to the MUX select 660 in an RX interval.

Figure 7:
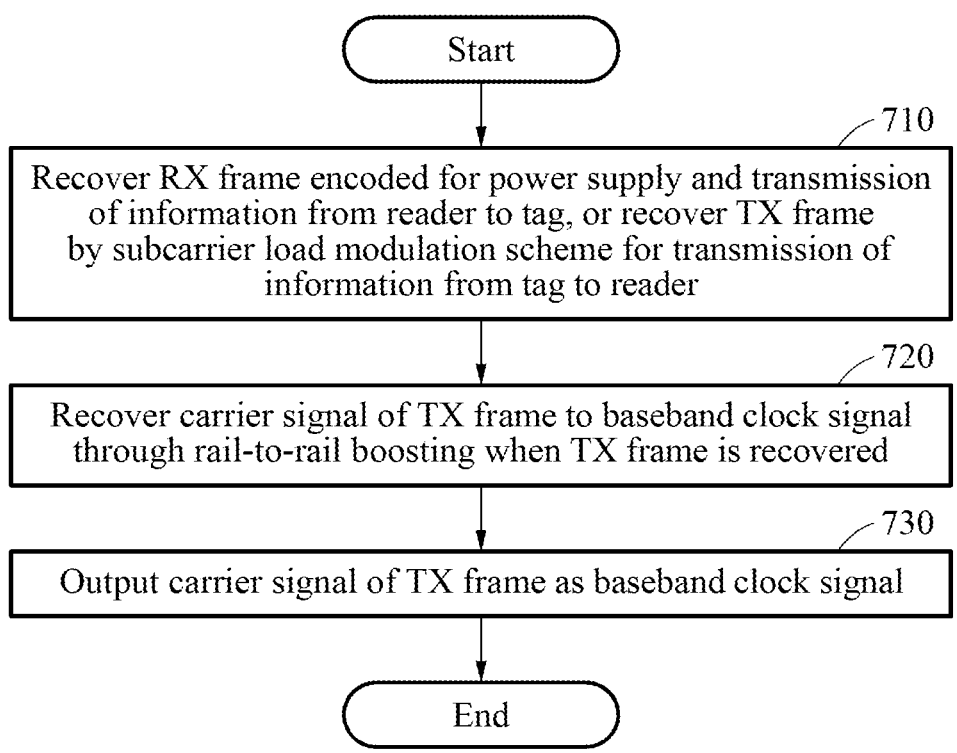
FIG. 7 is a flowchart illustrating an example NFC transceiver method.

FIG. 7 is a flowchart illustrating an example NFC transceiver method. Referring to FIG. 7, in operation 710, the NFC transceiver recovers an RX frame encoded for a power supply and information transmitted from a reader to a tag, or recovers a TX frame by a subcarrier load modulation for the information transmitted from the tag to the reader.

In operation 720, the NFC transceiver recovers the carrier signal of the TX frame to a baseband clock signal through a rail-to-rail boosting when the TX frame is recovered. For example, in a TX mode in which the TX frame is recovered, the NFC transceiver may convert the carrier signal of the TX frame into a full swing carrier signal through the rail-to-rail boosting. The NFC transceiver may output the full swing carrier signal as a baseband clock and may recover the carrier signal of the TX frame to the baseband clock signal.

The NFC transceiver may receive a mode selection signal that is based on one of the TX mode in which the TX frame is recovered, an RX mode in which the RX frame is received, and a pooling mode in which the NFC transceiver retrieves a target tag.

The NFC transceiver may select, based on the mode selection signal, a signal from an oscillating signal output through a first path passing through a first comparator and a PLL that is based on an OSC and the carrier signal of the TX frame output through a second path through the rail-to-rail boosting by a second comparator. In an example, when a mode selection signal based on the TX mode or the pooling mode is received, the NFC transceiver may inhibit the power supply to the OSC and the PLL, and may select the carrier signal of the TX frame output through the second path as the baseband clock signal. In an example, when a mode selection signal based on the RX mode is received, the NFC transceiver may supply power to the OSC and the PLL, and may select the oscillating signal output through the first path as the baseband clock signal.

In operation 730, the NFC transceiver outputs the carrier signal of the TX frame recovered in operation 720 as the baseband clock signal.

The methods of FIGS. 1-7 that perform the operations described in this application are performed by electronic or computing hardware, for example, by one or more processors or computers, implemented as described above executing instructions or software to perform one or more operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A near field communication (NFC) transceiver, comprising:
   a receiver, configured to recover a reception (RX) frame encoded with power supply information and information transmitted from a reader to a tag;
   a transmitter, configured to recover a transmission (TX) frame by a subcarrier load modulation scheme for information transmitted from the tag to the reader; and
   a clock recovery circuit configured to recover a carrier signal of the TX frame as a baseband clock signal of the NFC transceiver through a rail-to-rail boosting, while selectively turning off a phase-locked loop (PLL) depending on an operation mode of the NFC transceiver
   wherein the clock recovery circuit is further configured to:
     select a signal from an oscillating signal output through a first path passing through a first comparator and the PLL that is based on an oscillator (OSC) and the carrier signal of the TX frame output through a second path through the rail-to-rail boosting by a second comparator, based on one of a TX mode in which the TX frame is recovered, an RX mode in which the RX frame is received and a pooling mode in which the NFC transceiver retrieves a target tag; and
     output the selected signal as the baseband clock signal.

2. The NFC transceiver of claim 1, wherein the clock recovery circuit is further configured to:
   inhibit a supply of power for a generation of an oscillating signal; and
   use the carrier signal of the TX frame as the baseband clock signal in a TX mode in which the TX frame is recovered.

3. The NFC transceiver of claim 1, wherein, in the TX mode or the pooling mode, the clock recovery circuit is further configured to:
   inhibit a supply of power to the OSC and the PLL; and
   select the carrier signal of the TX frame output through the second path as the baseband clock signal.

4. The NFC transceiver of claim 1, wherein, in the RX mode, the clock recovery circuit is further configured to:
   supply power to the OSC and the PLL; and
   select the oscillating signal output through the first path as the baseband clock signal.

5. The NFC transceiver of claim 1, wherein, in a TX mode in which the TX frame is recovered, the clock recovery circuit is further configured to:
   convert the carrier signal of the TX frame into a full swing carrier signal; and
   output the full swing carrier signal as the baseband clock signal.

6. The NFC transceiver of claim 5, wherein the clock recovery circuit is further configured to convert the carrier signal of the TX frame into the full swing carrier signal through a load modulation signal amplification.

7. The NFC transceiver of claim 1, wherein the clock recovery circuit comprises:
   the PLL using the OSC configured to output an oscillating signal;
   a first comparator configured to compare the oscillating signal to a first reference signal;
   a second comparator configured to compare the carrier signal of the TX frame to a second reference signal for the rail-to-rail boosting; and
   a multiplexer (MUX) configured to select one of the oscillating signal and the carrier signal of the TX frame based on one of a TX mode in which the TX frame is recovered, an RX mode in which the RX frame is received, and a pooling mode in which the NFC transceiver retrieves a target tag.

8. The NFC transceiver of claim 7, wherein
the first comparator and the second comparator are identical to each other, and
the first reference signal and the second reference signal are identical to each other.

9. The NFC transceiver of claim 7, wherein a voltage of each of the first reference signal and the second reference signal is less than that of a full swing carrier signal obtained by converting the carrier signal of the TX frame through the rail-to-rail boosting.

10. A near field communication (NFC) transceiver apparatus, comprising a clock recovery circuit configured to:
inhibit a supply of power for a generation of an oscillating signal;
recover a carrier signal of a transmission (TX) frame as a baseband clock signal of an NFC transceiver through a rail-to-rail boosting, while selectively turning off a phase-locked loop (PLL) depending on an operating mode of the NFC transceiver;
select a signal from an oscillating signal output through a first path passing through a first comparator and the PLL that is based on an oscillator (OSC) and the carrier signal of the TX frame output through a second path through the rail-to-rail boosting by a second comparator, based on one of a TX mode in which the TX frame is recovered, an RX mode in which the RX frame is received and a pooling mode in which the NFC transceiver retrieves a target tag; and
output the selected signal as the baseband clock signal.

11. The apparatus of claim 10, wherein the clock recovery circuit comprises:
the PLL based on the OSC, which is configured to output the oscillating signal;
a first comparator, configured to compare the oscillating signal to a first reference signal;
a second comparator, configured to compare the carrier signal of the TX frame to a second reference signal for the rail-to-rail boosting; and
a multiplexer (MUX), configured to select one of the oscillating signal and the carrier signal of the TX frame based on one of a TX mode in which the TX frame is recovered, a reception (RX) mode in which an RX frame is received, and a pooling mode in which the NFC transceiver retrieves a target tag.

12. The apparatus of claim 11, wherein
the first comparator and the second comparator are identical to each other, and
the first reference signal and the second reference signal are identical to each other.

13. The apparatus of claim 11, wherein a voltage of each of the first reference signal and the second reference signal is less than a voltage of a full swing carrier signal obtained by converting the carrier signal of the TX frame through the rail-to-rail boosting.

14. A method of a near field communication (NFC) transceiver, the method comprising:
recovering a reception (RX) frame encoded with power supply information and information transmitted from a reader to a tag, or recovering a transmission (TX) frame by a subcarrier load modulation scheme for information transmitted from the tag to the reader; and
recovering a carrier signal of the TX frame to a baseband clock signal of the NFC transceiver through a rail-to-rail boosting, while selectively turning off a phase-locked loop (PLL) depending on an operation mode of the NFC transceiver,
wherein the recovering of the carrier signal of the TX frame comprises:
receiving a mode selection signal based on one of a TX mode in which the TX frame is recovered, an RX mode in which the RX frame is received, and a pooling mode in which the NFC transceiver retrieves a target tag;
selecting a signal from an oscillating signal output through a first path passing through a first comparator and the PLL that is based on the OSC and the carrier signal of the TX frame output through a second path through the rail-to-rail boosting by a second comparator, based on the mode selection signal; and
outputting the selected signal as the baseband clock signal.

15. The method of claim 14, wherein the selecting of the signal comprises, in response to a receipt of a mode selection signal based on the TX mode or the pooling mode:
inhibiting a power supply to the OSC and the PLL; and
selecting the carrier signal of the TX frame output through the second path as the baseband clock signal.

16. The method of claim 14, wherein the selecting of the signal comprises, in response to a receipt of a mode selection signal based on the RX mode:
supplying power to the OSC and the PLL; and
selecting the oscillating signal output through the first path as the baseband clock signal.

17. The method of claim 14, wherein the recovering of the carrier signal of the TX frame comprises, in a TX mode in which the TX frame is recovered:
converting the carrier signal of the TX frame into a full swing carrier signal through the rail-to-rail boosting; and
outputting the full swing carrier signal as the baseband clock signal.

18. A non-transitory computer-readable storage medium storing instructions that, when executed by a processor, cause the processor to control performance of the method of claim 14, including the recovering of the RX frame and the recovering the carrier signal of the TX frame.

* * * * *